United States Patent
Suda et al.

(10) Patent No.: US 11,832,526 B2
(45) Date of Patent: Nov. 28, 2023

(54) SPIN-ORBIT-TORQUE MAGNETIZATION ROTATIONAL ELEMENT AND MAGNETIC MEMORY

(71) Applicant: TDK CORPORATION, Tokyo (JP)

(72) Inventors: Keita Suda, Tokyo (JP); Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/578,625

(22) Filed: Jan. 19, 2022

(65) Prior Publication Data

US 2022/0140231 A1    May 5, 2022

Related U.S. Application Data

(63) Continuation of application No. 16/629,895, filed as application No. PCT/JP2018/032404 on Aug. 31, 2018, now Pat. No. 11,264,563.

(30) Foreign Application Priority Data

Sep. 4, 2017  (JP) ................. 2017-169733

(51) Int. Cl.
  *H10N 50/10*  (2023.01)
  *G11C 11/16*  (2006.01)
  *H10B 61/00*  (2023.01)
  *H10N 50/80*  (2023.01)

(52) U.S. Cl.
  CPC .......... *H10N 50/10* (2023.02); *G11C 11/161* (2013.01); *H10B 61/00* (2023.02); *H10N 50/80* (2023.02)

(58) Field of Classification Search
  CPC ...... H10N 50/10; H10N 50/80; G11C 11/161; H10B 61/00

(Continued)

(56) References Cited

U.S. PATENT DOCUMENTS 8,350,347 B2   1/2013   Gaudin et al.
2012/0228728 A1   9/2012   Ueki et al.
(Continued)

FOREIGN PATENT DOCUMENTS

JP   2010-010485 A   1/2010
JP   2012-186372 A   9/2012
(Continued)

OTHER PUBLICATIONS

Miron et al., "Perpendicular switching of a single ferromagnetic layer induced by in-plane current injection," Nature, Aug. 11, 2011, vol. 476, pp. 189-194.

(Continued)

*Primary Examiner* — Jami Valentine Miller

(74) *Attorney, Agent, or Firm* — Oliff PLC

(57) ABSTRACT

A spin-orbit-torque magnetization rotational element includes: a ferromagnetic metal layer, a magnetization direction of the ferromagnetic metal layer being configured to change; a spin-orbit torque wiring which extends in the first direction intersecting a lamination direction of the ferromagnetic metal layer and is joined to the ferromagnetic metal layer; and two via wires, each of which extends in a direction intersecting the spin-orbit torque wiring from a surface of the spin-orbit torque wiring opposite to a side with the ferromagnetic metal layer and is connected to a semiconductor circuit, wherein a via-to-via distance between the two via wires in the first direction is shorter than a width of the ferromagnetic metal layer in the first direction.

14 Claims, 6 Drawing Sheets

(58) Field of Classification Search
USPC .......................................................... 257/421
See application file for complete search history.

(56) References Cited

U.S. PATENT DOCUMENTS

| | | | |
|---|---|---|---|
| 2014/0104803 A1 | 4/2014 | Tsuyutani | |
| 2015/0348606 A1 | 12/2015 | Buhrman et al. | |
| 2016/0064654 A1 | 3/2016 | Tonegawa et al. | |
| 2017/0076769 A1 | 3/2017 | Shirotori et al. | |
| 2017/0077177 A1 | 3/2017 | Shimomura et al. | |
| 2017/0222135 A1 | 8/2017 | Fukami et al. | |
| 2017/0279038 A1* | 9/2017 | Wu | H10N 50/10 |
| 2018/0123026 A1* | 5/2018 | Sasaki | H03H 11/04 |
| 2018/0123028 A1* | 5/2018 | Shiokawa | H10N 50/85 |
| 2018/0337326 A1* | 11/2018 | Sasaki | H10N 50/10 |
| 2018/0375015 A1 | 12/2018 | Sasaki | |
| 2019/0074124 A1* | 3/2019 | Ishitani | H10N 50/10 |
| 2019/0088395 A1* | 3/2019 | Ota | H01F 10/3254 |
| 2019/0088711 A1* | 3/2019 | Shiokawa | H01F 10/3254 |
| 2019/0148629 A1* | 5/2019 | Sasaki | H01F 10/329 257/421 |
| 2019/0206431 A1* | 7/2019 | Sasaki | G11C 11/18 |
| 2019/0206602 A1* | 7/2019 | Sasaki | G01R 33/093 |
| 2019/0267542 A1* | 8/2019 | Komura | H10N 52/01 |
| 2019/0287706 A1* | 9/2019 | Shiokawa | H10N 50/10 |
| 2019/0288185 A1* | 9/2019 | Shiokawa | H01F 10/3272 |
| 2019/0319183 A1* | 10/2019 | Sasaki | H01L 29/82 |
| 2020/0083430 A1* | 3/2020 | Sasaki | H10B 61/00 |
| 2020/0136023 A1* | 4/2020 | Tsumita | G11C 11/1659 |
| 2020/0278403 A1* | 9/2020 | Shiokawa | G11C 11/161 |

FOREIGN PATENT DOCUMENTS

| | | |
|---|---|---|
| JP | 2014-082353 A | 5/2014 |
| JP | 2016-046492 A | 4/2016 |
| JP | 2017-059594 A | 3/2017 |
| JP | 2017-59679 A | 3/2017 |
| WO | 2016/021468 A1 | 2/2016 |

OTHER PUBLICATIONS

Kato et al., "Observation of the Spin Hall Effect in Semiconductors," Science, Dec. 10, 2004, vol. 306, pp. 1910-1913.

Liu et al., "Spin torque switching with the giant spin Hall effect of tantalum," Science, 2012, vol. 336, pp. 1-19 and vol. 555, pp. 1-12.

Liu et al., "Current-Induced Switching of Perpendicularly Magnetized Magnetic Layers Using Spin Torque from the Spin Hall Effect," Physical Review Letters, Aug. 31, 2012, vol. 109, pp. 096602-1-096602-5.

Lee et al., "Threshold current for switching of a perpendicular magnetic layer induced by spin Hall effect," Applied Physics Letters, 2013, vol. 102, pp. 112410-1-112410-5.

Lee et al; "Thermally activated switching of perpendicular magnet by spin-orbit spin torque"; Applied Physics Letters; 2014; vol. 104; pp. 072413-1-072413-5.

Fukami et al.; "Magnetization switching by spin-orbit torque in an antiferromagnet-ferromagnet bilayer system"; Nature Materials, May 2016, vol. 15, pp. 535-542.

Fukami et al., "A spin-orbit torque switching scheme with collinear magnetic easy axis and current configuration," Nature Nanotechnology, 2016, pp. 1-6.

Takahashi et al.; "Spin injection and detection in magnetic nanostructures"; Physical Review B, 2003, vol. 67, pp. 052409-1-052409-4.

Seo et al., "Area-Efficient SOT-MRAM With a Schottky Diode," IEEE Electron Device Letters, Aug. 2016, vol. 37, No. 8, pp. 982-985.

Zhang et al., "Spin Hall Effects in Metallic Antiferromagnets," Nov. 7, 2014, vol. 113, pp. 196602-1-196602-6.

Sato et al., "Perpendicular-anisotropy CoFeB—MgO magnetic tunnel junctions with a MgO/CoFeB/Ta/CoFeB/MgO recording structure," Applied Physics Letters, 2012, vol. 101, pp. 022414-1-022414-4.

Liu et al., "Magnetic Oscillations Driven by the Spin Hall Effect in 3-Terminal Magnetic Tunnel Junction Devices," Physical Review Letters, Nov. 2, 2012, vol. 109, pp. 186602-1-186602-5.

Kimura et al., "Electrical Control of the Direction of Spin Accumulation," Physical Review Letters, Oct. 19, 2007, vol. 99, pp. 166601-1-166601-4.

Oct. 30, 2018 International Search Report issued in International Patent Application No. PCT/JP2018/032404.

Jul. 8 ,2021 Office Action issued in U.S. Appl. No. 16/629,895.

Oct. 20, 2021, Notice of Allowance issued in U.S. Appl. No. 16/629,895.

Jan. 18, 2023 Office Action issued in Chinese Patent Application No. 201880052140.X.

* cited by examiner

SPIN-ORBIT-TORQUE MAGNETIZATION ROTATIONAL ELEMENT AND MAGNETIC MEMORY

This is a Continuation of application Ser. No. 16/629,895 filed Jan. 9, 2020, which claims the benefit of PCT 371 International Application No. PCT/JP/2018/032404, filed Aug. 31, 2018, which in turn claims the benefit of Japanese Patent Application No. 2017-169733, filed Sep. 4, 2017, the contents of which are incorporated herein by reference.

TECHNICAL FIELD

The present invention relates to a spin-orbit-torque magnetization rotational element and a magnetic memory.

BACKGROUND ART

Giant magnetoresistance (GMR) elements formed of multilayer films including ferromagnetic layers and non-magnetic layers and tunneling magnetoresistance (TMR) elements using insulating layers (tunnel barrier layers or barrier layers) as non-magnetic layers are known. These elements have attracted attention as elements for magnetic sensors, high frequency components, magnetic heads, and nonvolatile random access memories (MRAMs).

In an MRAM, data is read and written using characteristics in which an element resistance of a GMR element or a TMR element changes when directions of magnetization of two ferromagnetic layers having an insulating layer disposed therebetween change. As writing methods for MRAMs, a method in which writing (magnetization reversal) is performed using a magnetic field produced by a current and a method in which writing (magnetization reversal) is performed using a spin transfer torque (STT) occurring when a current flows in a lamination direction of a magnetoresistance effect element are known.

It is conceivable that magnetization reversals of TMR elements using an STT may be efficient in view of energy efficiency, but a reversal current density causing magnetization reversal to be performed be high. In terms of a long life of TMR elements, it is desirable that reversal current densities be low. This also applies to GMR elements.

Therefore, in recent years, magnetization reversal using a pure spin current generated due to a spin-orbit interaction has been attracting attention as a means for reducing a reversal current (for example, Non-Patent Document 1). The mechanism therefor has not yet become sufficiently clear. However, it is conceivable that a pure spin current generated due to a spin-orbit interaction or a Rashba effect at an interface between different materials induces a spin-orbit torque (SOT) and magnetization reversal occurs due to the SOT. A pure spin current is generated when the number of electrons with an upward spin is the same as the number of electrons with a downward spin and the electrons with an upward spin and the electrons with a downward spin flow in opposite directions and flows of charges cancel each other out. For this reason, a current flowing through a magnetoresistance effect element is zero and realization of a magnetoresistance effect element with a long lifespan would be expected.

These magnetic elements are used by integrating a plurality of elements in many cases rather than being used independently. The plurality of elements are connected to a semiconductor circuit to form an integrated circuit (IC). A magnetoresistance effect element is formed by laminating layers to a level of several atomic layers. For this reason, more precise control is required for incorporation into an integrated circuit, as compared with a capacitor, a diode, or the like incorporated in an integrated circuit in the related art.

For example, slight unevenness of a lamination surface for a magnetoresistance effect element laminated thereon causes a decrease in rate of change in magnetoresistance of the magnetoresistance effect element and variations in characteristics. For this reason, in the magnetic elements described in Patent Documents 1 to 3, positions in which via wires are formed and lamination surfaces having magnetoresistance effect elements laminated thereon may deviate from each other in an in-plane direction (for example, Patent Documents 1 to 3).

CITATION LIST

Patent Literature

[Patent Document 1]
Japanese Unexamined Patent Application, First Publication No. 2010-10485
[Patent Document 2]
Japanese Unexamined Patent Application, First Publication No. 2012-186372
[Patent Document 3]
Japanese Unexamined Patent Application, First Publication No. 2014-82353
[Non-Patent Document]
[Non-Patent Document 1]
I. M. Miron, K. Garello, G. Gaudin, P.-J. Zermatten, M. V. Costache, S. Auffret, S. Bandiera, B. Rodmacq, A. Schuhl, and P. Gambardella, Nature, 476, 189 (2011).

SUMMARY OF INVENTION

Technical Problem

However, if a magnetoresistance effect element and via wires are present at different positions in an in-plane direction, it is necessary to secure an area for each of the magnetoresistance effect element and the via wires and many elements cannot be integrated efficiently in one integrated circuit.

Also, disposing via wires so that in-plane positions of the via wires and a magnetoresistance effect element overlap causes the flatness of a lamination surface for a magnetoresistance effect element laminated thereon to be highly likely to be disturbed, which is avoided by a person skilled in the art.

Such disposition is avoided particularly in the case of a spin-orbit-torque magnetization rotational element. A spin-orbit-torque magnetization rotational element requires two via wires configured to supply a current to a spin-orbit torque wiring extending to a position at which the spin-orbit-torque magnetization rotational element intersects a lamination direction of a magnetoresistance effect element. When in-plane positions of two via wires and a magnetoresistance effect element overlap, a lamination surface is constituted of a plurality of members different from each other. Thus, the flatness of the lamination surface is even more likely to be disturbed. Furthermore, although it is ideal that a current flowing through a spin-orbit torque wiring flows in a direction orthogonal to a lamination interface of the spin-orbit torque wiring and a magnetoresistance effect element, if in-plane positions of the via wires and the magnetoresistance effect element overlap, a current flowing through the spin-orbit torque wiring easily has a component flowing obliquely.

The present disclosure was made in view of the above circumstances, and an object of the present disclosure is to improve integration of a spin-orbit-torque magnetization rotational element.

Solution to Problem

As a result of intensive investigations, the present inventors found that, even when two via wires and a magnetoresistance effect element are disposed so that in-plane positions of the two via wires and the magnetoresistance effect element overlap, a spin-orbit-torque magnetization rotational element shows sufficient performance. That is to say, it has been found that in-plane positions of two via wires and a magnetoresistance effect element can overlap, which has been avoided by a person skilled in the art and it has been found that a spin-orbit-torque magnetization rotational element can be efficiently integrated into an integrated circuit.

The present disclosure provides the following means to accomplish the above object.

(1) A spin-orbit-torque magnetization rotational element according to a first aspect includes: a ferromagnetic metal layer, a magnetization direction of the ferromagnetic metal layer being configured to change; a spin-orbit torque wiring which extends in a first direction intersecting a lamination direction of the ferromagnetic metal layer and is joined to the ferromagnetic metal layer; and two via wires, each of which extends in a direction intersecting the spin-orbit torque wiring from a surface of the spin-orbit torque wiring opposite to a side with the ferromagnetic metal layer and is connected to a semiconductor circuit, wherein a via-to-via distance between the two via wires in the first direction is shorter than a width of the ferromagnetic metal layer in the first direction.

(2) In the spin-orbit-torque magnetization rotational element according to the aspect, the spin-orbit torque wiring may have a laminated structure in a lamination direction thereof, and a resistance value of a first layer of the spin-orbit torque wiring provided on the ferromagnetic metal layer side may be lower than a resistance value of a second layer of the spin-orbit torque wiring provided on the via wires side.

(3) The spin-orbit-torque magnetization rotational element according to the aspect may further include a planarizing layer between the via wires and the spin-orbit torque wiring.

(4) In the spin-orbit-torque magnetization rotational element according to the aspect, the planarizing layer may be made of a nitride containing Ti or Ta.

(5) In the spin-orbit-torque magnetization rotational element according to the aspect, in a lamination surface for the ferromagnetic metal layer to be laminated thereon, a Vickers hardness difference between the two via wires and an interlayer insulating part configured to insulate between the two via wires may be 3 GPa or less.

(6) The spin-orbit-torque magnetization rotational element according to the aspect may further include a nonmagnetic layer and a magnetization fixed layer, a magnetization direction of the magnetization fixed layer being configured to be fixed to the ferromagnetic metal layer provided on a surface of the ferromagnetic metal layer opposite to a side with the spin-orbit torque wiring.

(7) In the spin-orbit-torque magnetization rotational element according to the aspect, an area of the ferromagnetic metal layer when viewed in a plan view from a vertical direction may be larger than an area of the magnetization fixed layer when viewed in a plan view from the vertical direction.

(8) A magnetic memory according to a second embodiment includes: a plurality of the spin-orbit-torque magnetization rotational elements according to the aspect.

Advantageous Effects of Invention

According to the present disclosure, it is possible to provide a spin-orbit-torque magnetization rotational element in which integration is able to be enhanced.

DESCRIPTION OF EMBODIMENTS

Figure 1:
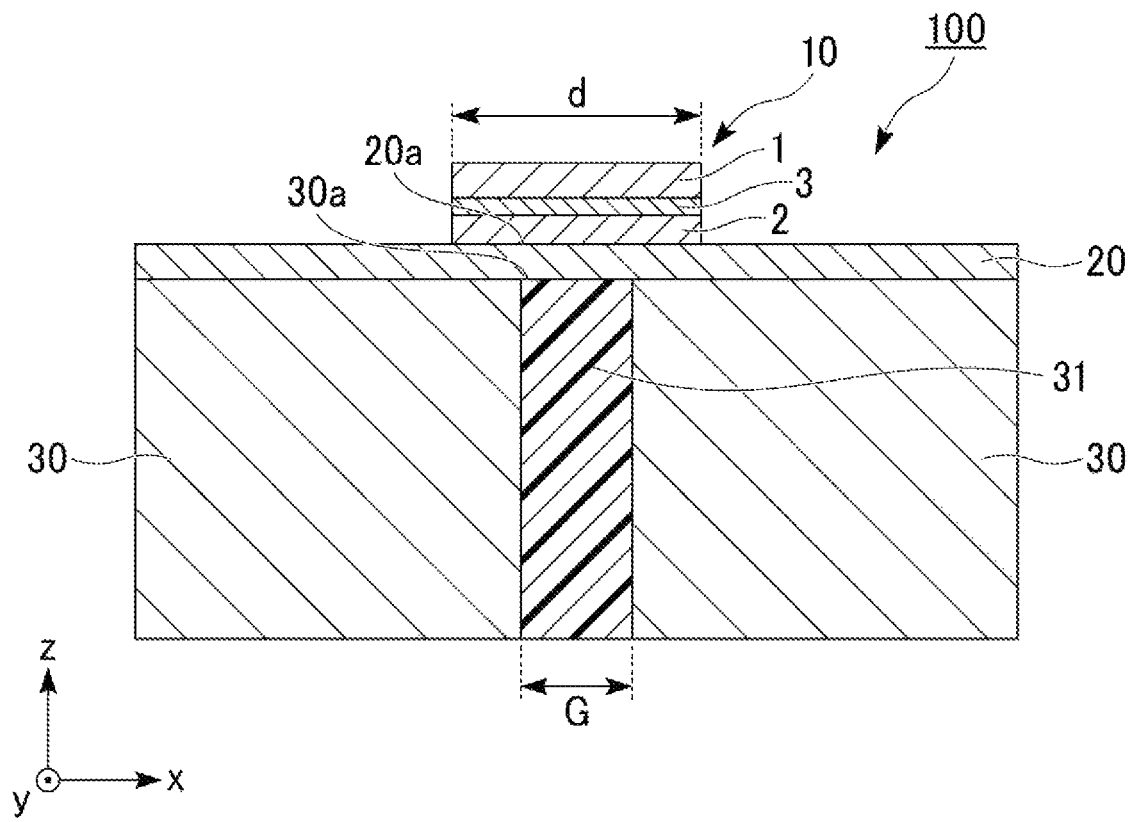
FIG. 1 is a schematic cross-sectional view of a spin-orbit-torque magnetization rotational element according to a first embodiment.

Embodiments of the present disclosure will be described below in detail with reference to the accompanying drawings. Note that, in the description associated with the drawings, constituent elements which are the same will be denoted with the same reference numerals and repeated description thereof will be omitted.

First Embodiment (Spin-Orbit-Torque Magnetization Rotational Element)

FIG. 1 is a perspective view schematically showing a spin-orbit-torque magnetization rotational element according to a first embodiment.

The spin-orbit-torque magnetization rotational element 100 according to the first embodiment includes a magnetoresistance effect element 10, a spin-orbit torque wiring 20, and two via wires 30.

Hereinafter, a vertical direction in which the via wires 30 extend from the spin-orbit torque wiring 20 is assumed to be a z direction, a first direction in which the spin-orbit torque wiring 20 extends is assumed to be an x direction, and a second direction orthogonal to both of the z direction and the x direction is assumed to be a y direction.

<Magnetoresistance Effect Element>

The magnetoresistance effect element 10 includes a first ferromagnetic metal layer 1 whose direction of magnetization is fixed, a second ferromagnetic metal layer 2 whose direction of magnetization changes, and a non-magnetic layer 3 disposed between the first ferromagnetic metal layer 1 and the second ferromagnetic metal layer 2.

The magnetoresistance effect element 10 operates when the magnetization of the first ferromagnetic metal layer 1 is fixed in one direction and the direction of magnetization of the second ferromagnetic metal layer 2 changes relatively. In the case of being applied to a coercivity-differing type (a pseudo spin valve type) MRAM, the coercivity of a first ferromagnetic metal layer in the magnetoresistance effect element is made to be larger than the coercivity of a second ferromagnetic metal layer therein. In the case of being applied to an exchange bias type (a spin valve type) MRAM, the magnetization of the first ferromagnetic metal layer in the magnetoresistance effect element is fixed through exchange coupling with an antiferromagnetic layer.

The magnetoresistance effect element 10 serves as a tunneling magnetoresistance (TMR) element when the non-magnetic layer 3 is made of an insulator and serves as a giant magnetoresistance (GMR) element when the non-magnetic layer 3 is made of a metal.

A lamination constitution of a magnetoresistance effect element can adopt a known lamination constitution for a magnetoresistance effect element. For example, each layer may be constituted of a plurality of layers and other layers such as an antiferromagnetic layer configured to fix a direction of magnetization of the first ferromagnetic metal layer 1 may be provided. The first ferromagnetic metal layer 1 is referred to as a fixed layer or a reference layer and the second ferromagnetic metal layer 2 is referred to as a free layer, a storage layer, or the like.

As materials for the first ferromagnetic metal layer 1, well-known materials can be used. For example, a metal selected from the group consisting of Cr, Mn, Co, Fe, and Ni and an alloy including at least one of these metals and exhibiting ferromagnetism can be used. Furthermore, an alloy including at least one of these metals and at least one element from B, C, and N can also be used. To be specific, Co—Fe and Co—Fe—B may be exemplified.

Also, in order to obtain a higher output, it is desirable to use a Heusler alloy such as $Co_2FeSi$. A Heusler alloy contains an intermetallic compound having a chemical composition represented by $X_2YZ$, where X represents a Co-, Fe-, or Ni-, Cu-group transition metal element or noble metal element in the periodic table, Y represents a Mn-, V-, Cr-, or Ti-group transition metal or an element of the X type in the periodic table, and Z represents a typical element from Group III to Group V. Examples of the Heusler alloy include $Co_2FeSi$, $Co_2MnSi$, $Co_2Mn_{1-a}Fe_aAl_bSi_{1-b}$, and the like.

Also, in order to further increase the coercivity of the first ferromagnetic metal layer 1 with respect to the second ferromagnetic metal layer 2, an antiferromagnetic material such as IrMn and PtMn may be used as a material in contact with the first ferromagnetic metal layer 1. Moreover, in order to prevent a leakage magnetic field of the first ferromagnetic metal layer 1 from affecting the second ferromagnetic metal layer 2, a synthetic ferromagnetic coupling structure may be adopted.

Furthermore, when the direction of magnetization of the first ferromagnetic metal layer 1 is perpendicular to a lamination surface thereof, it is desirable to use a laminated film made of Co and Pt. To be specific, the first ferromagnetic metal layer 1 can be formed in an order of FeB (1.0 nm)/Ta (0.2 nm)/[Pt (0.16 nm)/Co (0.16 nm)]$_4$/Ru (0.9 nm)/[Co (0.24 nm)/Pt (0.16 nm)]$_6$ from the non-magnetic layer 3 side.

As materials for the second ferromagnetic metal layer 2, ferromagnetic materials, particularly soft magnetic materials can be applied. For example, a metal selected from the group consisting of Cr, Mn, Co, Fe, and Ni, an alloy containing one or more of these metals, an alloy containing at least one of these metals and at least one element from B, C, and N, and the like can be used. To be specific, Co—Fe, Co—Fe—B, and Ni—Fe are exemplary examples.

When the direction of magnetization of the second ferromagnetic metal layer 2 is set to be perpendicular to the lamination surface thereof, it is desirable that a thickness of the second ferromagnetic metal layer 2 be 2.5 nm or less. It is possible to add perpendicular magnetic anisotropy to the second ferromagnetic metal layer 2 at an interface between the second ferromagnetic metal layer 2 and the non-magnetic layer 3. Furthermore, since the effect of the perpendicular magnetic anisotropy is attenuated by increasing a film thickness of the second ferromagnetic metal layer 2, it is desirable that the film thickness of the second ferromagnetic metal layer 2 be thin.

Well-known materials can be used for the non-magnetic layer 3.

For example, when the non-magnetic layer 3 is made of an insulator (in the case of a tunnel barrier layer), as materials thereof, $Al_2O_3$, $SiO_2$, MgO, $Ga_2O_3$, $MgAl_2O_4$, and the like can be used. In addition to these materials, materials and the like obtained by substituting a part of Al, Si, Ma in these materials with Zn, Be, or the like can also be used. Furthermore, materials obtained by substituting Mg in $MgAl_2O_4$ with Zn, materials obtained by substituting Al in $MgAl_2O_4$ with Ga or In, and the like can be used. Among these, MgO and $MgAl_2O_4$ have excellent lattice matching properties with respect to other layers.

When the non-magnetic layer 3 is made of a metal, Cu, Ag, or the like can be used as the material thereof. Furthermore, an alloy such as Ag—Sn and Ag—Mg can also be used. In addition, when the non-magnetic layer 3 is made of a semiconductor, Si, Ge, $CuInSe_2$, $CuGaSe_2$, $Cu(In, Ga)Se_2$, or the like can be used as the material thereof.

Also, the magnetoresistance effect element 10 may have other layers. For example, an underlayer may be provided on a surface of the second ferromagnetic metal layer 2 on the side opposite from the non-magnetic layer 3 and a cap layer may be provided on a surface of the first ferromagnetic metal layer 1 on the side opposite from the non-magnetic layer 3.

It is desirable that a layer disposed between the spin-orbit torque wiring 20 and the magnetoresistance effect element 10 do not dissipate spins propagating from the spin-orbit torque wiring 20. For example, it is known that silver, copper, magnesium, aluminum, and the like have long spin diffusion lengths of 100 nm or more and it is difficult for them to dissipate spins.

Also, it is desirable that a thickness of this layer be a spin diffusion length or less of materials constituting the layer. When a thickness of the layer is a spin diffusion length or less, spins propagating from the spin-orbit torque wiring 20 can be sufficiently transferred to the magnetoresistance effect element 10.

<Spin-Orbit Torque Wiring>

The spin-orbit torque wiring 20 extends in the x direction. The spin-orbit torque wiring 20 is connected to one surface of the second ferromagnetic metal layer 2 in the z direction. The spin-orbit torque wiring 20 may be directly connected to the second ferromagnetic metal layer 2 and may be connected to the second ferromagnetic metal layer 2 with another layer therebetween.

The spin-orbit torque wiring 20 is made of a material which generates a pure spin current due to a spin Hall effect when a current flows therethrough. Any material may be adopted as such a material as long as the material is configured to generate a pure spin current in the spin-orbit torque wiring 20. Therefore, the material is not limited to a material consisting of a single element and may be a material and the like composed of a portion constituted of a material which generates a pure spin current and a portion constituted of a material which does not generate a pure spin current.

A spin Hall effect is a phenomenon in which, when a current flows through a material, a pure spin current is induced in a direction orthogonal to a direction in which a current flows on the basis of a spin-orbit interaction.

Figure 2:
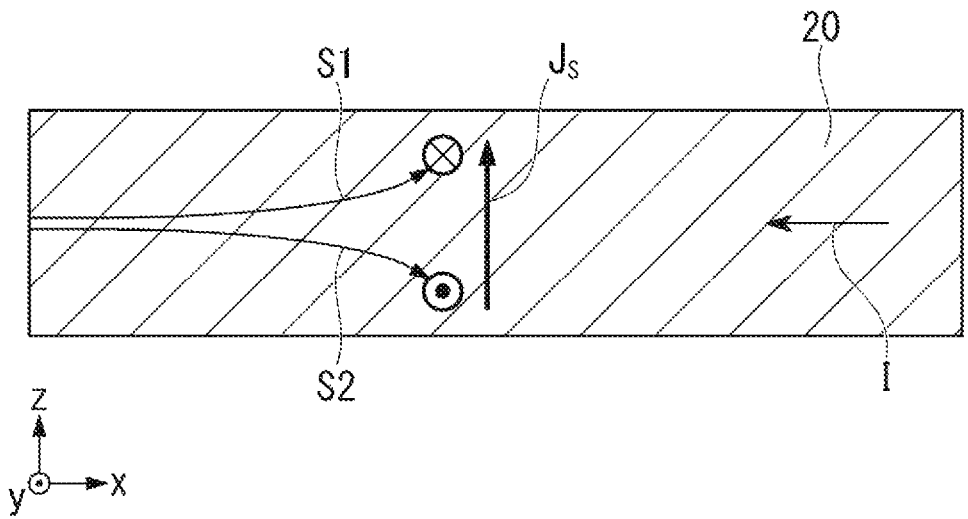
FIG. 2 is a schematic view showing a spin Hall effect.

FIG. 2 is a schematic view showing a spin Hall effect. FIG. 2 is a cross-sectional view of the spin-orbit torque wiring 20 shown in FIG. 1 cut in the x direction. A mechanism by which a pure spin current is generated due to a spin Hall effect will be described with reference to FIG. 2.

As shown in FIG. 2, when a current I flows in a direction in which the spin-orbit torque wiring 20 extends, first spins S1 oriented toward a side into the paper and second spins S2 oriented toward a side in front of the paper are bent in directions orthogonal to the current. A normal Hall effect and a spin Hall effect are the same in that a moving (traveling) direction of moving (traveling) charges (electrons) is bent. On the other hand, a normal Hall effect and a spin Hall effect significantly differ in that, in a normal Hall effect, charged particles moving in a magnetic field are subjected to a Lorentz force and thus a moving direction of the charged particles is bent, whereas in a spin Hall effect, as long as electrons travel (a current flows) even when no magnetic field is present, a traveling direction of spins is bent.

Since the number of electrons in the first spins S1 and the number of electrons in the second spins S2 are the same in a non-magnetic material (a material which is not a ferromagnetic material), in the drawings, the number of electrons in the first spins S1 directed upward is equal to the number of electrons in the second spins S2 directed downward. For this reason, a current serving as a net flow of charges is zero. A spin current which does not involve this current is particularly referred to as a pure spin current.

When a current is caused to flow in a ferromagnetic material, there is the same point in that the first spins S1 and the second spins S2 are bent in opposite directions. On the other hand, there is a difference in that an amount of one of the first spins S1 and the second spins S2 is large in a ferromagnetic material, and as a result, a net flow of charges occurs (a voltage is generated). Therefore, as the material for the spin-orbit torque wiring 20, a material consisting only of a ferromagnetic material is not included.

If a flow of electrons of the first spins S1 is represented by $J_\uparrow$, a flow of electrons of the second spins S2 is represented by $J_\downarrow$, and a spin current is represented by $J_S$, $J_S=J_\uparrow-J_\downarrow$ is defined. In FIG. 2, $J_S$ flows as a pure spin current upward in the drawings. $J_S$ is a flow of electrons having a polarization of 100%.

In FIG. 1, when a ferromagnetic material is brought into contact with an upper surface of the spin-orbit torque wiring 20, a pure spin current scatters and flows into the ferromagnetic material. That is to say, spins are injected into the magnetoresistance effect element 10.

The spin-orbit torque wiring 20 may contain a non-magnetic heavy metal. Heavy metals refer to metals having specific gravities greater than or equal to that of yttrium. The spin-orbit torque wiring 20 may be made only of a non-magnetic heavy metal.

In this case, it is desirable that non-magnetic heavy metals be non-magnetic metals having d electrons or f electrons in the outermost shell therein and having an atomic number of 39 or higher. This is because such non-magnetic metals have a large spin-orbit interaction which causes a spin Hall effect. The spin-orbit torque wiring 20 may be made only of a non-magnetic metal having d electrons or f electrons in the outermost shell therein and a large atomic number of 39 or higher.

When a current flows in a metal, all electrons generally move in a direction opposite to that in which the current flows regardless of their spin orientation. On the other hand, non-magnetic metals having high atomic numbers having d electrons or f electrons in the outermost shell have a large spin-orbit interaction. Thus, a direction in which electrons move depends on a direction of spins in the electrons due to a spin Hall effect and a pure spin current $J_s$ is easily generated.

Also, the spin-orbit torque wiring 20 may contain a magnetic metal. A magnetic metal refers to a ferromagnetic metal or an antiferromagnetic metal. This is because, when a small amount of magnetic metal is contained in a non-magnetic metal, a spin-orbit interaction is enhanced and it is possible to increase a spin current generation efficiency with respect to a current flowing through the spin-orbit torque wiring 20. The spin-orbit torque wiring 20 may be made only of an antiferromagnetic metal.

Since a spin-orbit interaction is caused due to an intrinsic internal field of a substance of a spin-orbit torque wiring material, a pure spin current is generated even in a non-magnetic material. When a small amount of magnetic metal is added to a spin-orbit torque wiring material, a magnetic metal itself scatters spins of flowing electrons. Thus, a spin current generation efficiency is improved. Here, when an amount of magnetic metal to be added is excessively increased, a generated pure spin current scatters due to the added magnetic metal, and as a result, an action of reducing a spin current increases. Therefore, it is desirable that a molar ratio of a magnetic metal to be added be sufficiently smaller than a molar ratio of a main ingredient of a pure spin generation portion in a spin-orbit torque wiring. For reference, a molar ratio of a magnetic metal to be added is preferably 3% or less.

Also, the spin-orbit torque wiring 20 may include a topological insulator. The spin-orbit torque wiring 20 may be made only of a topological insulator. A topological insulator is a substance in which an inside of the substance is made of an insulator or a high resistance substance and a spin-polarized metal state occurs in a surface thereof. This substance has an internal magnetic field called a spin-orbit interaction. Thus, a new topological phase appears due to an effect of a spin-orbit interaction even when no external magnetic field is present. This is a topological insulator and it is possible to generate a pure spin current with high efficiency therewith due to a strong spin-orbit interaction and breakdown of rotational symmetry at an edge.

As topological insulators, for example, SnTe, $Bi_{1.5}Sb_{0.5}Te_{1.7}Se_{1.3}$, $TlBiSe_2$, $Bi_2Te_3$, $Bi_{1-x}Sb_x$,$(Bi_{1-x}Sb_x)_2Te_3$, and the like are desirable. These topological insulators can generate a spin current with high efficiency.

<Via Wire>

The via wires 30 extend in a direction intersecting the spin-orbit torque wiring 20 from a surface of the spin-orbit torque wiring 20 on the side opposite from the second ferromagnetic metal layer 2. In FIG. 1, the via wires 30 extend in a vertical direction of the spin-orbit torque wiring 20. End portions of the via wires 30 on the side opposite from the spin-orbit torque wiring 20 are connected to a semiconductor circuit. For example, a transistor, a resistive element, a capacitor, or the like may be connected to the semiconductor circuit having the via wires 30 connected thereto.

As shown in FIG. 1, a via-to-via distance G of two via wires 30 in the x direction is shorter than a width d of the second ferromagnetic metal layer 2 in the x direction. When the via-to-via distance G is shorter than the width d of the second ferromagnetic metal layer 2 in the x direction, the via wires 30 and the magnetoresistance effect element 10 overlap when viewed from the z direction.

When the magnetoresistance effect element 10 and the via wires 30 do not overlap when viewed from the z direction, an area corresponding to the sum of areas of the magnetoresistance effect element 10 and the via wires 30 is required for one element. On the other hand, when the via wires 30 and the magnetoresistance effect element 10 partially overlap when viewed from the z direction, an area required for one element is reduced by an amount corresponding to this overlapping area. That is to say, it is possible to integrate a plurality of elements in an integrated circuit more efficiently.

Widths of the via wires 30 in the x direction and the y direction are designed and cannot be freely changed. For example, a minimum processing dimension (a feature size: F) in a current semiconductor is said to be 7 nm and the widths of the via wires 30 in the x direction and the y direction are at least 7 nm. In other words, it is difficult to reduce the widths of the via wires 30 in the x direction and the y direction by this size or more and it is difficult to improve the integration by changing the areas of the via wires 30.

A highly conductive material can be used for the via wires 30. For example, copper, aluminum, silver, and the like are exemplary examples. In addition to these materials, a nitride film or the like having conductivity can be used.

The two via wires 30 are insulated using an interlayer insulating part 31. The interlayer insulating part 31 is an insulating layer using which wirings in multilayer wirings and elements are insulated. The interlayer insulating part 31 can be made of the same material as that used for a semiconductor device or the like. For example, a silicon oxide ($SiO_x$), a silicon nitride ($SiN_x$), a silicon carbide (SiC), a chromium nitride (CrN), silicon carbonitride (SiCN), silicon oxynitride (SiON), aluminum oxide ($Al_2O_3$), zirconium oxide ($ZrO_x$), and the like may be used.

A Vickers hardness difference between the interlayer insulating part 31 and the via wires 30 is preferably 3 GPa or less. When the Vickers hardness difference between the interlayer insulating part 31 and the via wires 30 is 3 GPa or less, a polishing state of a lamination surface 30a on which the spin-orbit torque wiring 20 is laminated can be made constant using chemical mechanical polishing (CMP) or the like. As a result, the lamination surface 30a having the spin-orbit torque wiring 20 laminated thereon can be planarized. Furthermore, if the lamination surface 30a is planarized, the flatness of the lamination surface 20a having the magnetoresistance effect element 10 laminated thereon is also enhanced.

CMP is one of methods which, even when different substances are present in one plan, can similarly perform polishing using a physical force and a chemical force. For this reason, even when the Vickers hardness difference between the interlayer insulating part 31 and the via wires 30 is large, the flatness can be enhanced. However, layers constituting the magnetoresistance effect element 10 have thicknesses of about several nm and a slight step also affects the characteristics of the magnetoresistance effect element 10 (for example, the orientation of the magnetization in the magnetoresistance effect element 10). When the Vickers hardness difference between the interlayer insulating part 31 and the via wires 30 is 3 GPa or less, it is also possible to minimize the occurrence of a slight level difference which affects the characteristics of the magnetoresistance effect element 10.

It is desirable that at least one of the following first or second condition be satisfied as an index of sufficient flatness without a slight level difference.

The first condition is that a difference in height position between the via wires 30 and the interlayer insulating part 31 in the z direction is 1.5 nm or less. A difference in height position is preferably 1.2 nm or less, more preferably 1.0 nm or less.

A difference in height position between the via wires 30 and the interlayer insulating part 31 in the z direction refers to lengths of perpendicular lines drawn from highest points of the via wires 30 in the z direction to an average surface of the interlayer insulating part 31 in a height direction thereof. The average surface of the interlayer insulating part 31 in the height direction thereof refers to a surface which extends to an average height position of the interlayer insulating part 31 in the z direction.

The second condition is that a degree of convexity obtained by dividing the difference in height position between the via wires 30 and the interlayer insulating part 31 in the z direction by the width d of the interlayer insulating part 31 is 0.015 or less. The degree of convexity is preferably 0.012 or less, more preferably 0.010 or less. The degree of convexity refers to a degree of convexity in a protruding direction when the interlayer insulating part 31 protrudes from the via wire 30 and refers to a degree of convexity in a recessed direction when the interlayer insulating part 31 is recessed from the via wire 30.

As a specific combination in which the Vickers hardness difference between the interlayer insulating part 31 and the via wires 30 is 3 GPa or less, the following combinations can be conceivable.

For example, when the interlayer insulating part 31 is silicon oxide, vanadium nitride can be used for the via wires 30.

Also, for example, when the interlayer insulating part 31 is zirconium oxide, a nitride containing any selected from the group consisting of Nb, V, and Al can be used for the via wires 30.

Furthermore, for example, when the interlayer insulating part 31 is silicon nitride, a nitride containing any one selected from the group consisting of Nb, Zr, and Al can be used for the via wires 30.

In addition, for example, when the interlayer insulating part 31 is any of chromium nitride, silicon mononitride, and aluminum oxide, a nitride containing Ti or Zr can be used for the via wires 30.

(Operation of Spin-Orbit-Torque Magnetization Rotational Element)

The spin-orbit-torque magnetization rotational element 100 controls a direction of magnetization of the second ferromagnetic metal layer 2 using a spin-orbit torque (SOT) induced by spins injected through the spin-orbit torque wiring 20.

When a potential difference is applied between the two via wires 30, a current flows in the x direction in which the spin-orbit torque wiring 20 extends. When a current flows in the spin-orbit torque wiring 20, a spin Hall effect occurs. Unidirectionally oriented spins generated due to a spin Hall effect are injected into the second ferromagnetic metal layer 2. The spins injected into the second ferromagnetic metal layer 2 cause a spin-orbit torque (SOT) to be applied to the magnetization of the second ferromagnetic metal layer 2 and the direction of magnetization of the second ferromagnetic metal layer 2 changes (a writing operation).

A resistance value of the magnetoresistance effect element 10 changes in accordance with a change relative angle between the direction of magnetization of the first ferromagnetic metal layer 1 and the direction of magnetization of the second ferromagnetic metal layer 2. Data can be read out by detecting a change in resistance value of the magnetoresistance effect element 10.

Second Embodiment

Figure 3:
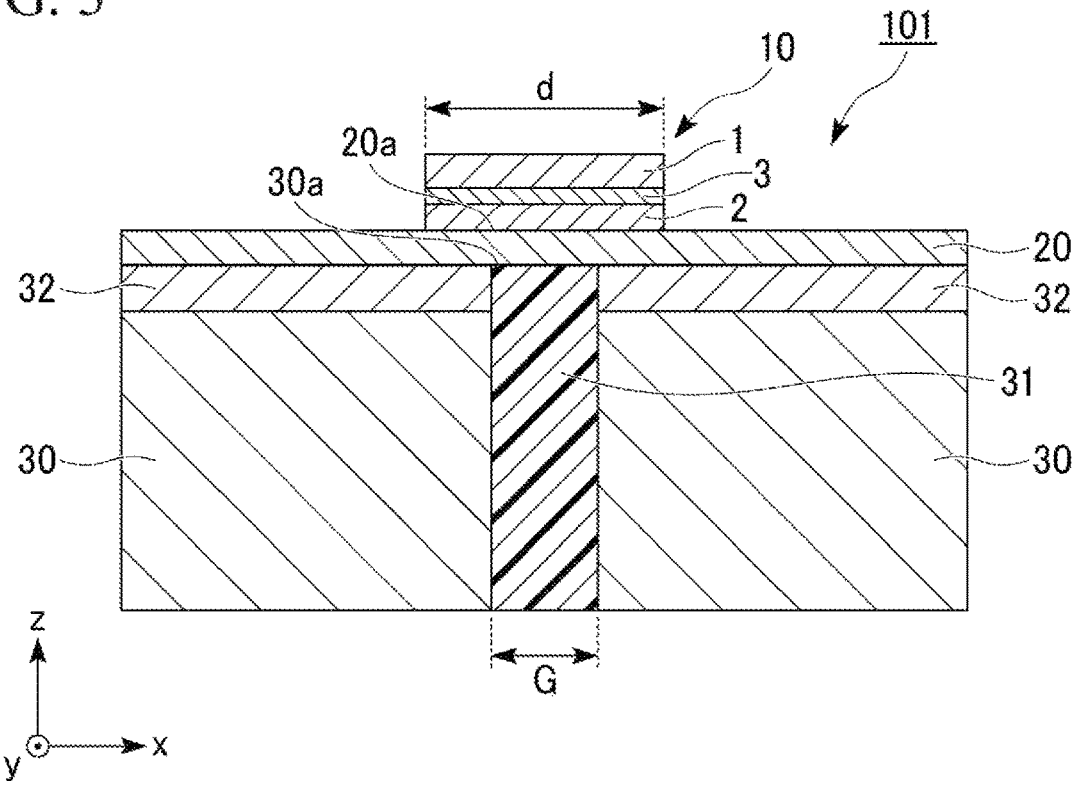
FIG. 3 is a schematic cross-sectional view of a spin-orbit-torque magnetization rotational element according to a second embodiment.

FIG. 3 is a schematic cross-sectional view of a spin-orbit-torque magnetization rotational element 101 according to a second embodiment. The spin-orbit-torque magnetization rotational element 101 shown in FIG. 3 and the spin-orbit-torque magnetization rotational element 100 according to the first embodiment differ in that, in the spin-orbit-torque magnetization rotational element 101, planarizing layers 32 are formed between a spin-orbit torque wiring 20 and via wires 30. In FIG. 3, constituent elements in the spin-orbit-torque magnetization rotational element 101 that are the same as those of the spin-orbit-torque magnetization rotational element 100 according to the first embodiment will be denoted with the same reference numerals as those of those of the spin-orbit-torque magnetization rotational element 100 and description thereof will be omitted.

The planarizing layers 32 have conductivity and are layers configured to enhance the flatness of a lamination surface 30a having a spin-orbit torque wiring 20 laminated thereon. A nitride containing any selected from the group consisting of Ti, Nb, V, Ta, Zr, and Al can be used for the planarizing layers 32. Among these, it is desirable to use a nitride containing Ti or Ta for the planarizing layers 32.

A Vickers hardness difference between an interlayer insulating part 31 and the planarizing layers 32 is preferably 3 GPa or less. By providing the planarizing layers 32, the selectivity of a material forming via wires 30 can be enhanced. A specific combination in which the Vickers hardness difference between the interlayer insulating part 31 and the planarizing layer 32 is 3 GPa or less is the same as the relationship between the interlayer insulating part 31 and the via wires 30 described above.

By enhancing the flatness of the lamination surface 30a using the planarizing layers 32, it is possible to further minimize the occurrence of a slight level difference which affects the characteristics of a magnetoresistance effect element 10. Furthermore, the selectivity of the material which can be used for the via wires 30 can increase and a material with higher conductivity can be used for the via wires 30.

Third Embodiment

Figure 4:
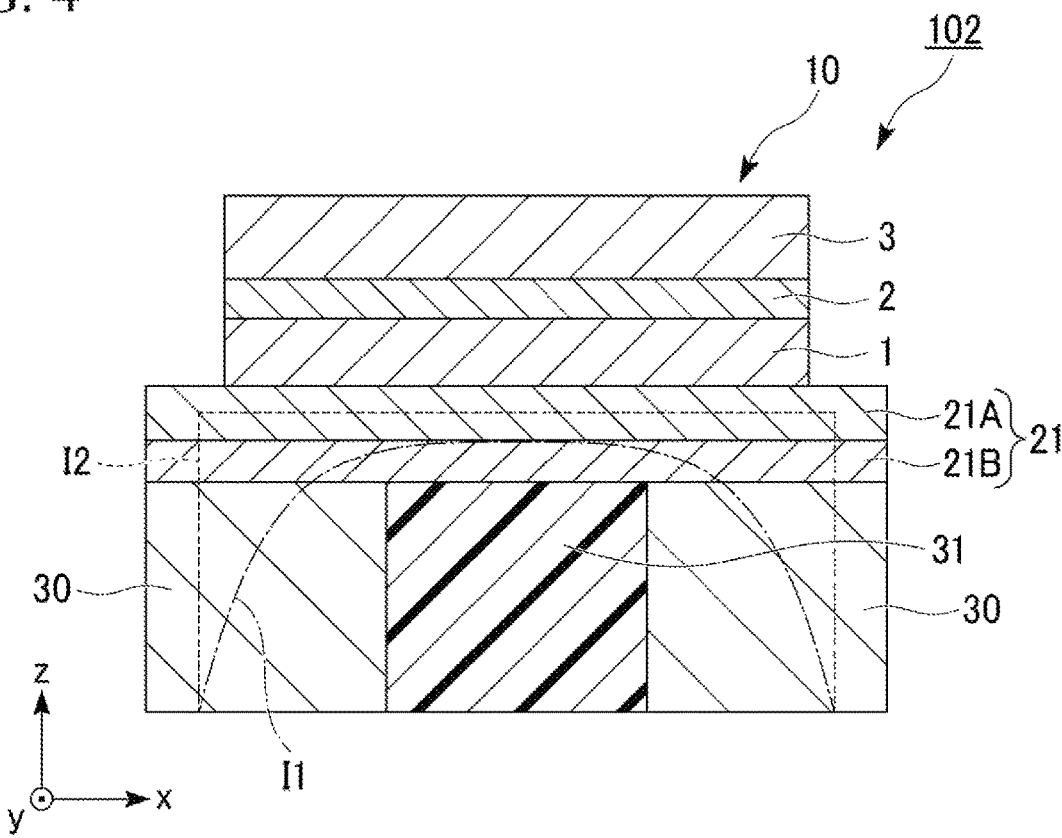
FIG. 4 is a schematic enlarged cross-sectional view of a main part of a spin-orbit-torque magnetization rotational element according to a third embodiment.

FIG. 4 is a schematic enlarged cross-sectional view of a main part of a spin-orbit-torque magnetization rotational element 102 according to a third embodiment. The spin-orbit-torque magnetization rotational element 102 shown in FIG. 4 and the spin-orbit-torque magnetization rotational element 100 according to the first embodiment differ in that, in the spin-orbit-torque magnetization rotational element 102, two layers of spin-orbit torque wirings 21 are provided. In FIG. 4, constituent elements in the spin-orbit-torque magnetization rotational element 102 that are the same as those of the spin-orbit-torque magnetization rotational element 100 according to the first embodiment will be denoted with the same reference numerals as those of the spin-orbit-torque magnetization rotational element 100 and description thereof will be omitted.

In the spin-orbit-torque magnetization rotational element 102 shown in FIG. 4, the spin-orbit torque wirings 21 have a laminated structure in the z direction. The spin-orbit torque wirings 21 shown in FIG. 4 include a first layer 21A on a second ferromagnetic metal layer 2 side and a second layer 21B on via wires 30 side. Although FIG. 4 shows two layers of laminated structures of a spin-orbit torque wiring 21, three or more layers of laminated structures may be provided.

A resistance value of the first layer 21A is lower than a resistance value of the second layer 21B. When the resistance value of the first layer 21A is lower than the resistance value of the second layer 21B, a current flows on the first layer 21A side. For this reason, a current I2 first flows from the via wires 30 toward the first layer 21A in the z direction and then flows in the x direction. On the other hand, when the spin-orbit torque wiring is a single layer (the first embodiment), a current I1 flowing through the via wires 30 and the spin-orbit torque wiring 20 flows in a shortest distance.

The current I2 has more components in the x direction than that of the current I1 in a region immediately below the magnetoresistance effect element 10 in the z direction. A spin Hall effect occurs in a direction orthogonal to a direction in which a current flows. For this reason, when the current I2 has many components in the x direction, spins can be efficiently injected into the second ferromagnetic metal layer 2.

Fourth Embodiment

Figure 5:
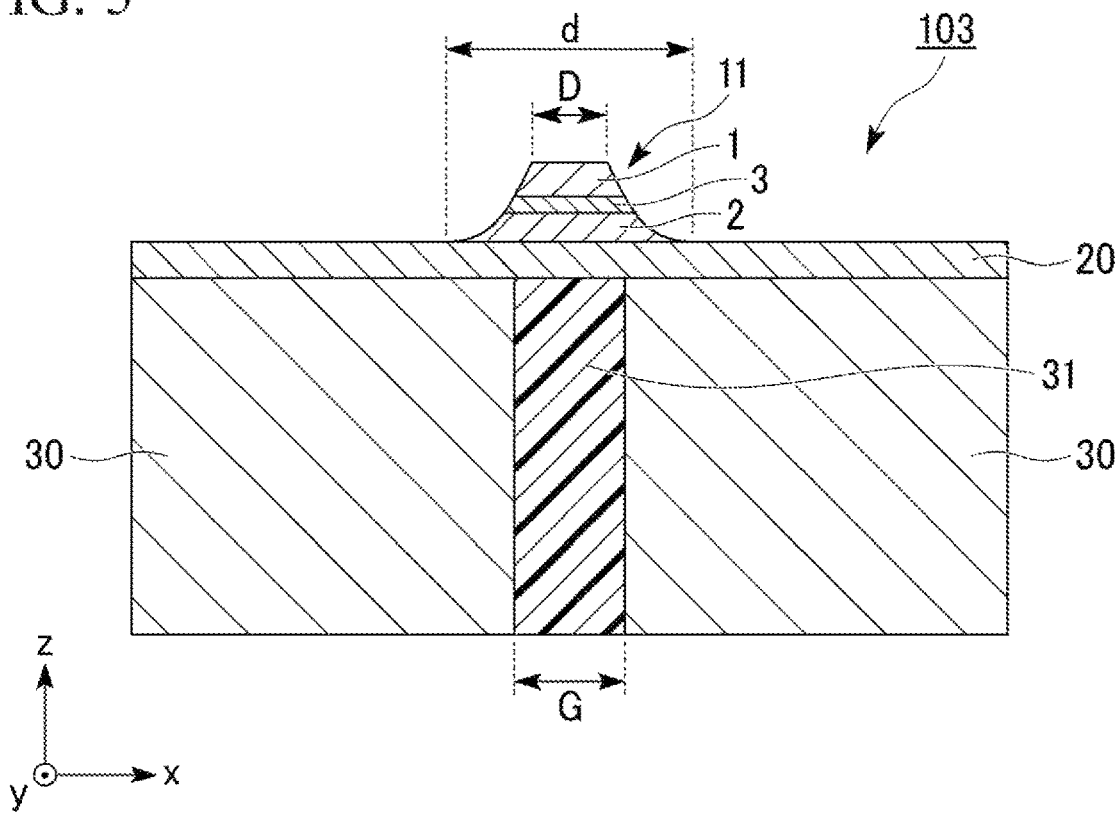
FIG. 5 is a schematic cross-sectional view of a spin-orbit-torque magnetization rotational element according to a fourth embodiment.

FIG. 5 is a schematic cross-sectional view of a spin-orbit-torque magnetization rotational element 103 according to a fourth embodiment. The spin-orbit-torque magnetization rotational element 103 shown in FIG. 5 and the spin-orbit-torque magnetization rotational element 100 according to the first embodiment differ in that, in the spin-orbit-torque magnetization rotational element 103, the width of a cross section of a magnetoresistance effect element 11 widens from a first ferromagnetic metal layer 1 toward a second ferromagnetic metal layer 2. Constituent elements in the spin-orbit-torque magnetization rotational element 103 in FIG. 5 that are the same as those of the spin-orbit-torque magnetization rotational element 100 will be denoted with the same as those of the spin-orbit-torque magnetization rotational element 100 according to the first embodiment and description thereof will be omitted.

In the spin-orbit-torque magnetization rotational element 103 shown in FIG. 5, the width of the cross section of the magnetoresistance effect element 11 widens from the first ferromagnetic metal layer 1 toward the second ferromagnetic metal layer 2. A via-to-via distance G of two via wires in the x direction is shorter than a width d of the second ferromagnetic metal layer 2 in the x direction. The width d of the second ferromagnetic metal layer 2 in the x direction refers to a width at a lamination interface between the second ferromagnetic metal layer 2 and a spin-orbit torque wiring 20.

Also, an area of the second ferromagnetic metal layer 2 when viewed in a plan view from the z direction is larger than an area of the first ferromagnetic metal layer 1 when viewed in a plan view from the z direction. That is to say, a volume of the second ferromagnetic metal layer 2 is larger than a volume of the first ferromagnetic metal layer 1. When the volume of the second ferromagnetic metal layer 2 is large, the stability of the magnetization in the second ferromagnetic metal layer 2 is enhanced. A direction of magnetization in the magnetization of the second ferromagnetic metal layer 2 more easily changes than that of the magnetization of the first ferromagnetic metal layer 1. When the direction of magnetization of the second ferromagnetic metal layer 2 changes, data held by the magnetoresistance effect element 11 is rewritten. When the magnetization of the second ferromagnetic metal layer 2 is stabilized, data can be stably held for a long period of time.

Also, it is desirable that the width d of the first ferromagnetic metal layer 1 in the x direction be narrower than the via-to-via distance G. The width d of the first ferromagnetic metal layer 1 in the x direction refers to a width of the first ferromagnetic metal layer 1 in the x direction on a surface farthest from the spin-orbit torque wiring 20.

When the width d of the first ferromagnetic metal layer 1 in the x direction narrows, the first ferromagnetic metal layer 1 has a high resistance. That is to say, i is possible to minimize a part of a current flowing through the spin-orbit torque wiring 20 from being shunted in a lamination direction (the z direction) of the magnetoresistance effect element 11. When an x component of a current flowing through the spin-orbit torque wiring 20 is increased, the magnetization of the second ferromagnetic metal layer 2 can rotate more efficiently due to SOT.

Fifth Embodiment

Figure 6:
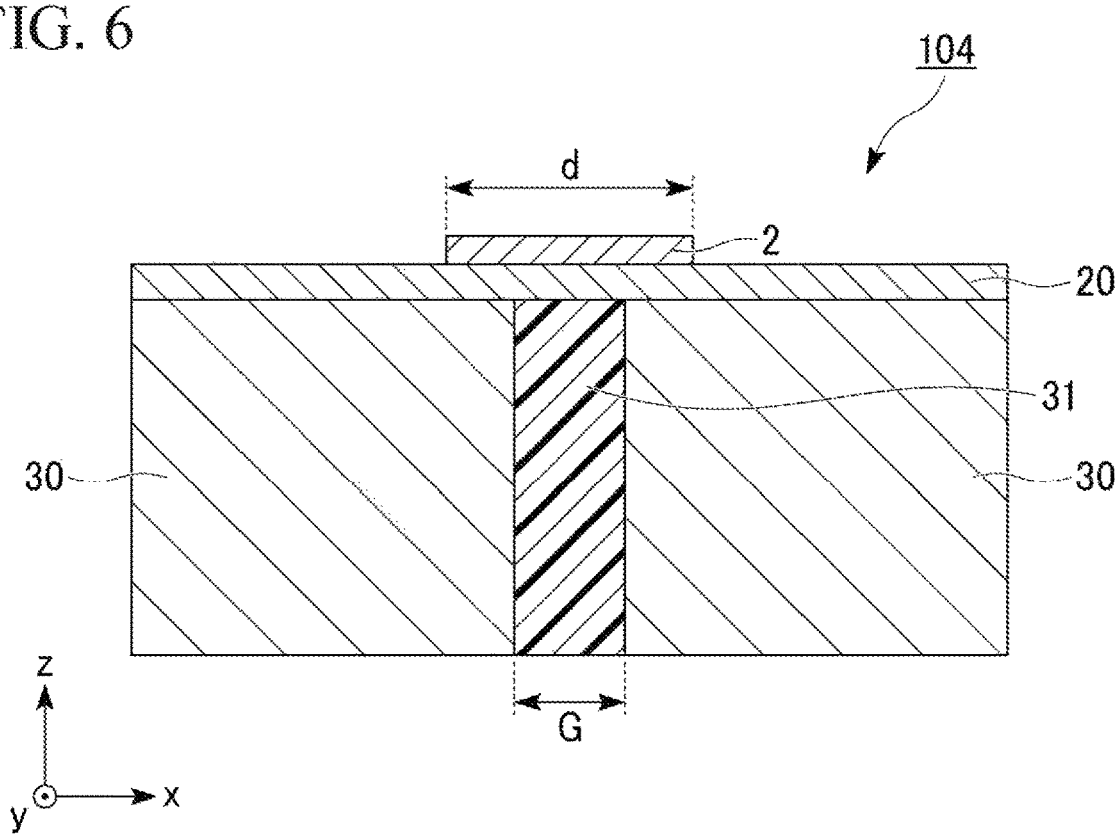
FIG. 6 is a schematic cross-sectional view of a spin-orbit-torque magnetization rotational element according to a fifth embodiment.

FIG. 6 is a schematic cross-sectional view of a spin-orbit-torque magnetization rotational element 104 according to a fifth embodiment. The spin-orbit-torque magnetization rotational element 104 shown in FIG. 6 and the spin-orbit-torque magnetization rotational element 100 according to the first embodiment differ in that the spin-orbit-torque magnetization rotational element 104 does not include a non-magnetic layer 3 and a first ferromagnetic metal layer 1. Constituent elements in the spin-orbit-torque magnetization rotational element 104 in FIG. 6 that are the same as those of the spin-orbit-torque magnetization rotational element 100 according to the first embodiment will be denoted with the same reference numerals as those of the spin-orbit-torque magnetization rotational element 100 according to the first embodiment and description thereof will be omitted.

The spin-orbit-torque magnetization rotational element 104 according to the fifth embodiment shown in FIG. 6 does not include the non-magnetic layer 3 and the first ferromagnetic metal layer 1. The spin-orbit-torque magnetization rotational element 104 functions as an element even without theses layers. For example, the spin-orbit-torque magnetization rotational element 104 can be used as an AMR (magnetic anisotropy) sensor or a spatial light modulator using a magnetic Kerr effect or a magnetic Faraday effect.

Figure 7:
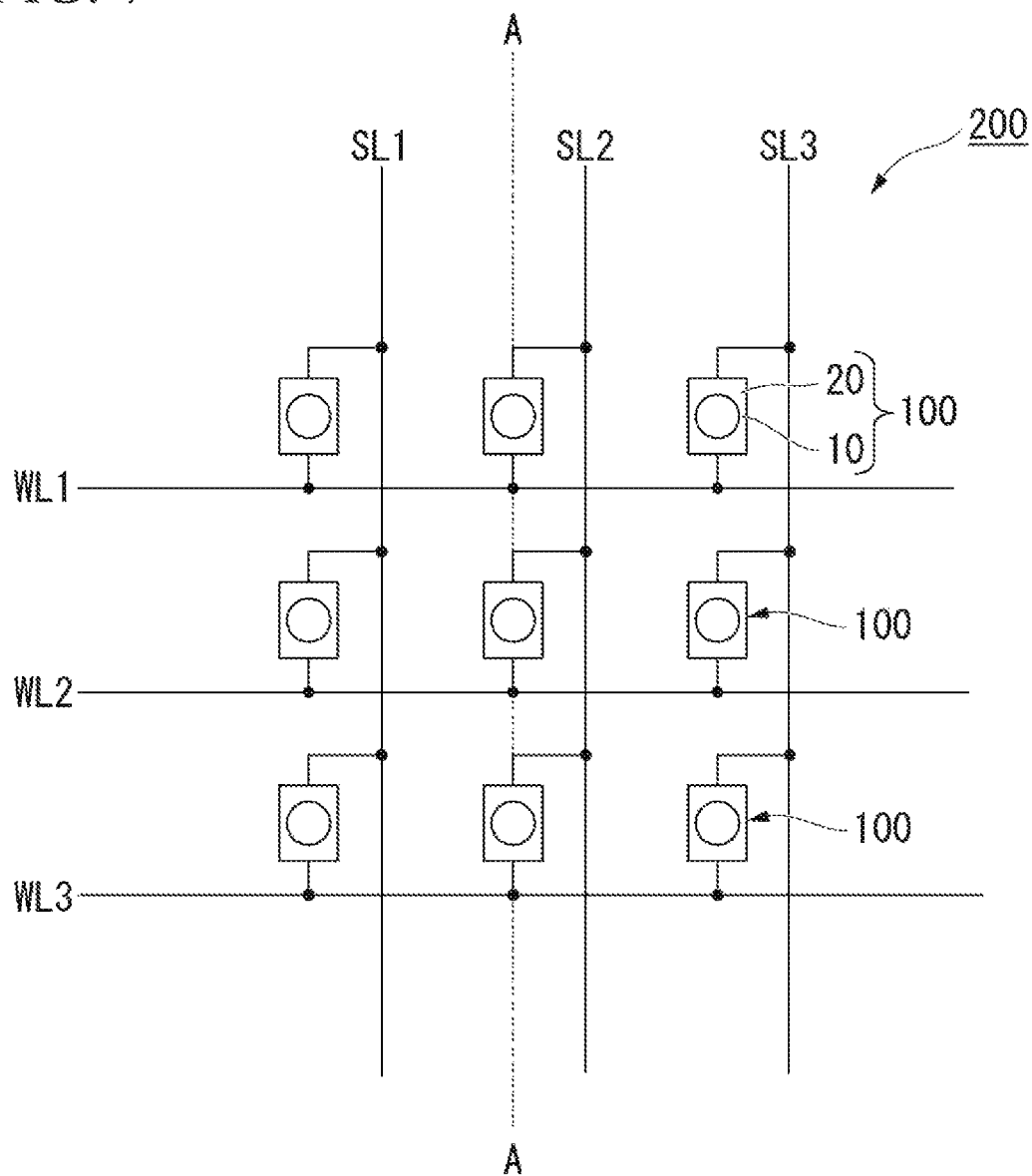
FIG. 7 is a schematic view of a magnetic memory including any one of the spin-orbit-torque magnetization rotational elements according to the first embodiment to the fifth embodiment.

As described above, in the spin-orbit-torque magnetization rotational element according to the first embodiment to the fifth embodiment, via wires and a magnetoresistance effect element partially overlap when viewed from the z direction. For this reason, an area required for one element can be reduced by an amount corresponding to this overlapping area and a plurality of elements can be integrated more efficiently in an integrated circuit. Furthermore, by providing a plurality of the spin-orbit-torque magnetization rotational elements according to the first embodiment to the fifth embodiment, it is possible to obtain a magnetic memory 200 having an excellent integration (FIG. 7).

Although the preferred embodiments of the present disclosure have been described above in detail, the present disclosure is not limited to the specific embodiments and various changes and modifications are possible without departing from the scope of the gist of the present disclosure as set forth in the claims.

EXAMPLES

Example 1

As shown in FIG. 1, a spin-orbit-torque magnetization rotational element 100 which has via wires 30 and a magnetoresistance effect element 10 disposed so that the via wires 30 and the magnetoresistance effect element 10 partially overlap when viewed from the z direction was prepared.

In the spin-orbit-torque magnetization rotational element 100, the constitutions and thicknesses of the layers were as follows so that the directions of magnetization of the first ferromagnetic metal layer 1 and the second ferromagnetic metal layer 2 were directed in the z direction. A planar shape of the magnetoresistance effect element 10 from the z direction was circular and a diameter d thereof was 100 nm. The first ferromagnetic metal layer 1 was made of CoFeB and had a thickness of 1 nm. The non-magnetic layer 3 was made of MgO and had a thickness of 1 nm. The second ferromagnetic metal layer 2 was formed of CoFeB (1.0 nm)/W (0.15 nm)/[Pt (0.16 nm)/Co (0.16 nm)]$_4$/Ru (0.9 nm)/[Co (0.24 nm)/Pt (0.16 nm)]$_6$. Furthermore, the spin-orbit torque wiring 20 was made of W and had a thickness of 3 nm and a width in the y direction of 200 nm. The via wires 30 and the interlayer insulating part 31 were prepared using Cu and SiO$_2$ and via-to-via distances G were 90, 80, 70, 60, and 50 nm.

Reversal current values of a spin-orbit-torque magnetization rotational element 100 according to Example 1 were measured. The reversal current values and the via-to-via distances G are shown in Table 1. It should be noted that measurement was performed by flowing a write current Iw and applying a magnetic field of 50 Oe in the x direction using a reversal current being a pulse of 5 nsec. A direction of magnetization was determined using a magnetoresistance effect caused by flowing a read current Jr in a lamination direction. Therefore, in the case of the reversal current values, the reversal current values were estimated based on a resistance change obtained from the read current Ir after alternately applying the write current Iw and the read current Jr and increasing the write current Iw.

TABLE 1

| Via-to-via distance G [nm] | 90 | 80 | 70 | 60 | 50 |
|---|---|---|---|---|---|
| Reversal current value [μA] | 120 | 119 | 120 | 118 | 119 |

Comparative Example 1

Figure 8:
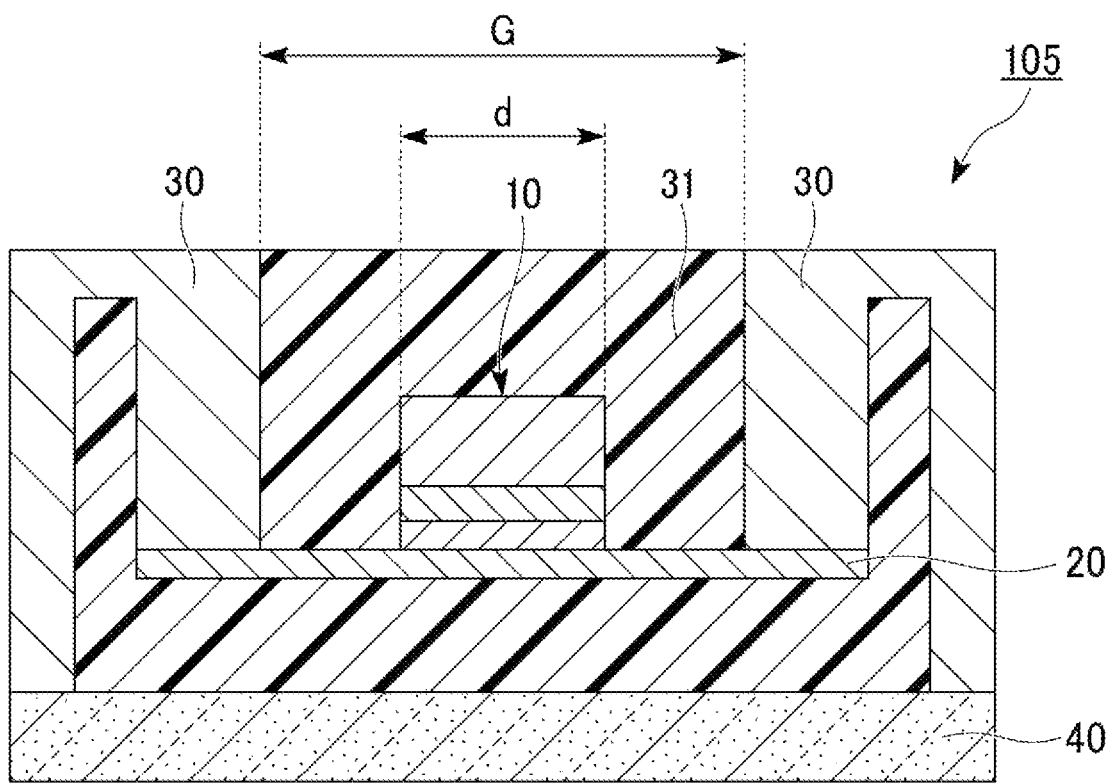
FIG. 8 is a schematic cross-sectional view of a spin-orbit-torque magnetization rotational element according to Comparative Example 1.

In Comparative Example 1, as shown in FIG. 8, a spin-orbit-torque magnetization rotational element 105 in which via wires 30 and a magnetoresistance effect element 10 does not partially overlap when viewed from the z direction was manufactured.

The spin-orbit-torque magnetization rotational element 105 shown in FIG. 8 includes the magnetoresistance effect element 10, a spin-orbit torque wiring 20, the via wires 30, an interlayer insulating part 31, and a semiconductor circuit 40. The via wires 30 connected to the semiconductor circuit 40 are connected to a position different from that of a magnetoresistance effect element on the same surface as a surface of the spin-orbit torque wiring 20 on which the magnetoresistance effect element 10 is laminated. Materials and the like used for constitutions in Comparative Example 1 were the same as in Example 1. Furthermore, via-to-via distances G were 180, 160, 140, 120, and 100 nm, a spin-orbit torque wiring 20 was made of W and had a thickness of 3 nm and a width of 200 mn in the y direction. A planar shape of the magnetoresistance effect element 10 from the z direction was circular and a diameter d thereof was 100 nm.

Reversal current values of a spin-orbit-torque magnetization rotational element 100 according to Comparative Example 1 were measured. The reversal current values and the via-to-via distances G are shown in Table 2. It should be noted that measurement was performed by flowing a write current Iw and applying a magnetic field of 50 Oe in the x direction using a reversal current being a pulse of 5 nsec. A direction of magnetization was determined using a magnetoresistance effect caused by flowing a read current Ir in a lamination direction. Therefore, in the case of the reversal current values, the reversal current values were estimated based on a resistance change obtained from the read current Ir after alternately applying the write current Iw and the read current Ir and increasing the write current Iw.

TABLE 2

| Via-to-via distance G [nm] | 100 | 120 | 140 | 160 | 180 |
|---|---|---|---|---|---|
| Reversal current value [μA] | 122 | 124 | 127 | 125 | 126 |

Figure 9:
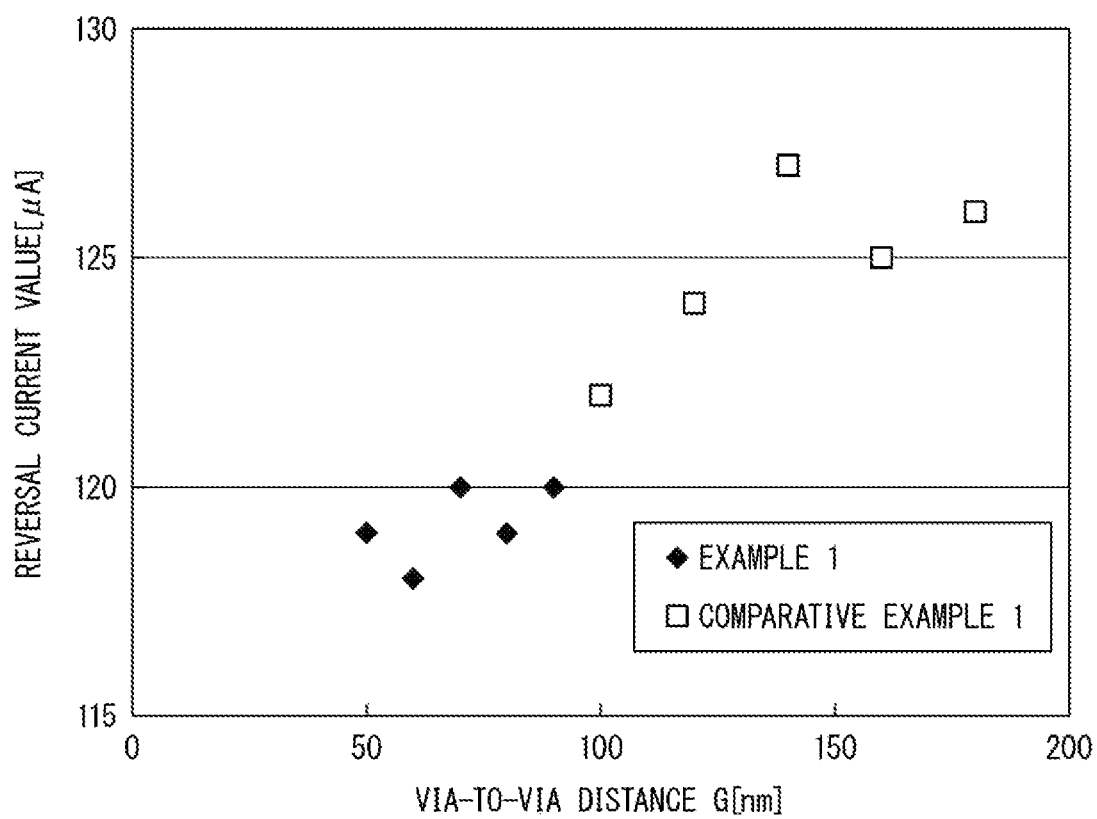
FIG. 9 is a graph showing examination results of Example 1 and Comparative Example 1.

The results of Example 1 and Comparative Example 1 are shown in FIG. 9. In Example 1, although the via wires 30 and the magnetoresistance effect element 10 partially overlap when viewed from the z direction, a decrease in the reversal current value was observed. Generally, it can be conceivable that, since a portion in which the via wires 30 and the magnetoresistance effect element 10 overlap when viewed from the z direction has almost no current component in the x direction, the overlapping portion does not easily cause magnetization reversal. However, in FIG. 9, even in a region in which the reversal current value and the via-to-via distance G are narrower than a length d of the magnetoresistance effect element 10 in the x direction, the reversal current value decreases. Furthermore, since an area required for one memory cell is reduced by setting the via-to-via distance G smaller than the width of the magnetoresistance effect element 10 in the x direction, it is possible to form a magnetic memory having a higher degree of integration than that in the art. That is to say, even with a constitution which has been avoided by a person of ordinary skill in the art, sufficient characteristics are shown and it has been confirmed that the constitution can improve the accumulation while securing sufficient characteristics.

INDUSTRIAL APPLICABILITY

According to the present disclosure, it is possible to provide a spin-orbit-torque magnetization rotational element capable of enhancing an integration.

REFERENCE SIGNS LIST

1 First ferromagnetic metal layer
2 Second ferromagnetic metal layer
3 Non-magnetic layer
10, 11 Magnetoresistance effect element
20, 21 Spin-orbit torque wiring
21A First layer
21B Second layer
30 Via wire
31 Interlayer insulating part
32 Planarizing layer
40 Semiconductor circuit
100, 101, 102, 103, 104, 105 Spin-orbit-torque magnetization rotational element

The invention claimed is:

1. A spin-orbit-torque magnetization rotational element, comprising:
   a ferromagnetic metal layer, a magnetization direction of the ferromagnetic metal layer being configured to change;
   a spin-orbit torque wiring which extends in a first direction intersecting a lamination direction of the ferromagnetic metal layer and is joined to the ferromagnetic metal layer; and
   a via wire (i) which extends from a first surface of the spin-orbit torque wiring in a direction intersecting the first direction and (ii) that is connected to a semiconductor circuit, wherein:
   the ferromagnetic layer is joined to a second surface of the spin-orbit torque wiring; and
   the first surface is opposite the second surface.

2. The spin-orbit-torque magnetization rotational element according to claim 1, wherein
   the spin-orbit torque wiring has a laminated structure in a lamination direction of the spin-orbit torque wiring, and
   a resistance value of a first layer of the spin-orbit torque wiring that is adjacent to the ferromagnetic metal layer is lower than a resistance value of a second layer of the spin-orbit torque wiring that is adjacent to the via wire.

3. The spin-orbit-torque magnetization rotational element according to claim 1, further comprising:
   a planarizing layer between the via wire and the spin-orbit torque wiring, wherein the planarizing layer is made of a nitride containing Ti or Ta.

4. The spin-orbit-torque magnetization rotational element according to claim 1, wherein,
   the via wire consists of two via wires, and
   a Vickers hardness difference between the two via wires and an interlayer insulating part configured to insulate the two via wires is 3 GPa or less.

5. The spin-orbit-torque magnetization rotational element according to claim 1, further comprising:

a non-magnetic layer and a magnetization fixed layer, a magnetization direction of the magnetization fixed layer being configured to be fixed to the ferromagnetic metal layer,
wherein the non-magnetic layer and the magnetization fixed layer are on an opposite side of the ferromagnetic metal layer from the spin-orbit torque wiring.

6. The spin-orbit-torque magnetization rotational element according to claim 5, wherein an area of the ferromagnetic metal layer when viewed in a plan view from a vertical direction is larger than an area of the magnetization fixed layer when viewed in the plan view from the vertical direction.

7. The spin-orbit-torque magnetization rotational element according to claim 1, wherein the via wire and the magnetoresistance effect element partially overlap, when viewed in a plan view from a vertical direction.

8. The spin-orbit-torque magnetization rotational element according to claim 1, wherein the via wire and the magnetoresistance effect element do not overlap, when viewed in a plan view from a vertical direction.

9. The spin-orbit-torque magnetization rotational element according to claim 4, wherein a difference in height position between the via wire and the interlayer insulating part in a vertical direction is 1.5 nm or less.

10. The spin-orbit-torque magnetization rotational element according to claim 4, wherein a degree of convexity obtained by dividing difference in height position between the via wire and the interlayer insulating part in a vertical direction by width of the interlayer insulating part is 0.015 or less.

11. The spin-orbit-torque magnetization rotational element according to claim 5, wherein the non-magnetic layer is made of an insulator which is at least one selected from a group consisting of $Al_2O_3$, $SiO_2$, MgO, $Ga_2O_3$, $MgAl_2O_4$, materials obtained by substituting a part of Al, Si, Ma in $Al_2O_3$, $SiO_2$, MgO, $Ga_2O_3$, and $MgAl_2O_4$ with Zn or Be, materials obtained by substituting Mg in $MgAl_2O_4$ with Zn, and materials obtained by substituting Al in $MgAl_2O_4$ with Ga or In.

12. The spin-orbit-torque magnetization rotational element according to claim 5, wherein the non-magnetic layer is made of a material which is at least one selected from a group consisting of Cu, Ag, Ag—Sn, Ag—Mg, Si, Ge, $CuInSe_2$, $CuGaSe_2$, and $Cu(In, Ga)Se_2$.

13. The spin-orbit-torque magnetization rotational element according to claim 1, wherein the ferromagnetic metal layer is made of a material which is at least one selected from a group consisting of Cr, Mn, Co, Fe, Ni, alloy including at least one of Cr, Mn, Co, Fe, N, and an alloy including at least one of Cr, Mn, Co, Fe, N and at least one of B and C.

14. The spin-orbit-torque magnetization rotational element according to claim 5, wherein the magnetization fixed layer is made of a material which is at least one selected from a group consisting of Cr, Mn, Co, Fe, Ni, alloy including at least one of Cr, Mn, Co, Fe, N, and an alloy including at least one of Cr, Mn, Co, Fe, N and at least one of B and C.

* * * * *